(12) United States Patent
Heinlein et al.

(10) Patent No.: US 6,365,423 B1
(45) Date of Patent: Apr. 2, 2002

(54) METHOD OF INSPECTING A DEPTH OF AN OPENING OF A DIELECTRIC MATERIAL LAYER

(75) Inventors: Frank Heinlein; Georg Sulzer, both of Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/921,121

(22) Filed: Aug. 2, 2001

(30) Foreign Application Priority Data

Jan. 24, 2001 (DE) .......................... 101 03 061

(51) Int. Cl.[7] .............................. H01L 21/66
(52) U.S. Cl. .................. 438/14; 438/15; 438/16; 438/17; 438/9
(58) Field of Search ............... 438/14, 15, 16, 438/17, 9; 357/4

(56) References Cited

U.S. PATENT DOCUMENTS

| | | | | |
|---|---|---|---|---|
| 5,079,600 A | * | 1/1992 | Schnur et al. | 357/4 |
| 5,972,725 A | * | 10/1999 | Wollesen et al. | 438/14 |
| 6,232,134 B1 | * | 5/2001 | Farber et al. | 438/9 |
| 6,261,852 B1 | * | 7/2001 | Chou et al. | 438/14 |

* cited by examiner

*Primary Examiner*—John F. Niebling
*Assistant Examiner*—Olivia T Luk
(74) *Attorney, Agent, or Firm*—Williams, Morgan & Amerson, P.C.

(57) ABSTRACT

For determining the quality of an opening formed in a dielectric material layer, a voltage contrast inspection tool is used to produce a voltage contrast image of a test pattern formed in the dielectric material layer. The voltage contrast values of openings may be compared to a reference contrast value or to different openings so as to decide whether or not the opening has a required depth.

34 Claims, 1 Drawing Sheet

METHOD OF INSPECTING A DEPTH OF AN OPENING OF A DIELECTRIC MATERIAL LAYER

BACKGROUND OF THE INVENTION

1. Field of the Invention

The present invention relates to methodology used in the manufacture of integrated circuit devices, and, more particularly, to a method of detecting the depth of an opening in a dielectric material layer formed on a substrate, such as a semiconductor substrate, so as to adjust critical etch parameters required for accurate control of the depth of the openings.

2. Description of the Related Art

Many fabrication processes in the manufacture of semiconductor integrated circuits (ICs) involve the sequential formation of layers of materials on the wafer surface, which are patterned by photolithographical steps and subsequent etching procedures so as to form structures having feature sizes down to 0.25 micrometers and beyond as is the case in most recent very large scale integration (VLSI) designs. Usually, insulating layers cover most of the surface of the substrate, and windows or openings are formed in the insulating layer through which contacts can be made to underlying electrically conductive regions, or in which devices or features have to be formed. In the manufacturing process of VLSI devices, plasma etch techniques are of immense importance, since these techniques are capable of an anisotropic etching, which is mandatory when feature heights have comparable dimensions to feature line widths and spaces. Generally, these plasma etch techniques provide a considerably higher etch rate in the vertical direction than in the horizontal direction, so that a desired edge profile can be obtained. In order to attain precisely patterned features, such as contact holes and via holes, it is necessary to accurately control the etch rate. However, the etch rate of a given etch process depends on a plurality of parameters such as excitation frequency of the plasma, flow rate of the reactive gases which are provided to form the plasma, pressure of the reactive gases and RF power dissipated in the plasma. Since complicated interdependencies between these parameters exist, it is very difficult to calculate the average etch rate of any etch process so as to determine the time or duration the etch process must be performed to complete the process, i.e., until substantially all of the desired material is removed. Generally, etching is therefore allowed to continue for an over-etch period necessary to compensate any etch rate non-uniformity caused by parameter drifts. Since the erosion of underlying layers, however, should be kept as small as possible, it is important, on the other hand, to minimize the over-etch time. This is particularly true for the critical dielectric contact or via hole etch in modern VLSI devices, wherein openings having a high aspect ratio have to be formed in a thick dielectric layer. In order to maintain a high quality standard in performing critical etch processes, it is necessary to continuously monitor the etch process and steadily readjust process parameters which may slightly drift due to small variations of the etch conditions and the complex mutual relationships of the parameters. For example, increasing amounts of contamination in the process chamber, which depends on the number of wafers that have been etched, leads to a subtle variation of the conditions in the etch process.

Accordingly, in the prior art methodology, the etch depth in forming contact holes and via holes in the dielectric stack is monitored by SEM (scanning electron microscopy) cross-section analysis. To this end, a test wafer is prepared, for example, by depositing a silicon oxide layer having a thickness which corresponds to the required depth of the opening to be formed in the manufacturing process, and an etch process is performed in the etch tool, wherein the parameters of the etch process may be monitored. Subsequently, a few single specimens from the test wafer, preferably from the edge and the center, are cleaved and SEM-inspected. Generally, the preparation of the test wafer and the SEM inspection takes place out of the clean room, i.e., outside of the manufacturing area. In the meantime, the etch equipment may be released for use in production operations so as to avoid any delay of the manufacturing process, with the risk of producing defective integrated circuits, or may be kept on hold until the result of the cross-section analysis is provided. Preparing the test wafer for SEM inspection and carrying out the analysis typically takes at least a few hours. Such a corresponding delay in production significantly contributes to the production cost of the semiconductor device. However, releasing the etch equipment for production prior to receiving the SEM results may yield a large number of processed wafers which do not satisfy the etch specification required for the further processing of these wafers. Thus, in either case, the conventional methodology with respect to etch depth analyses significantly contributes to the overall production costs in the manufacture of VLSI devices.

The present invention is directed to a method that solves or reduces some or all of the aforementioned problems.

SUMMARY OF THE INVENTION

According to one aspect of the present invention, there is provided a method of inspecting a depth of an opening in a dielectric material layer formed on a substrate, wherein the method comprises the steps of: depositing a dielectric material layer of a predefined thickness on a surface of the substrate, forming a predefined pattern of openings in the dielectric material layer at at least one predetermined position on the substrate, providing a voltage contrast inspection tool and determining a voltage contrast image of the predefined pattern, comparing the determined voltage contrast image with a reference image corresponding to a voltage contrast image for the predefined pattern with the openings fully opened down to a surface of the substrate, and estimating the amount of dielectric material covering the bottom of the openings based upon the comparison between the measured voltage contrast image and the reference image.

According to a second aspect of the present invention there is provided a method of inspecting a depth of an opening in a dielectric material layer formed on a substrate, wherein the method comprises the steps of: depositing a dielectric material layer of a predefined thickness on a surface of the substrate, forming at least two predefined patterns of openings in the dielectric material layer at respective predetermined positions on the substrate, providing a voltage contrast inspection tool and determining a voltage contrast image of the predefined patterns, comparing the respective voltage contrast images with each other, and estimating the amount of dielectric material covering a bottom of the openings of one of the at least two predefined patterns based upon said comparison of said respective contrast images.

According to the present invention, an efficient and fast method of inspecting patterns on a test wafer with respect to the depth of an opening is provided, since no specimen preparation, such as cleavage of the test wafer, is necessary and the inspection tool is commercially available and may be located within the clean room. In this manner, typically an inspection result or a test wafer may be obtained within several minutes, depending on the number of patterns, compared to several hours or more in the conventional procedure. When a plurality of patterns is distributed over the entire surface of the test wafer, a large amount of information in comparison to the conventional method may be obtained, since a large number of openings may be scanned without the necessity to precisely prepare, i.e., cleave, the test wafer at the plural locations of patterns on the wafer, as is the case in the cross-sectional analysis. Furthermore, the results of the analysis do not depend on conditions of sample preparation as is the case when test wafers have to be cleaved and prepared for cross-section SEM analysis. Accordingly, process parameters of process equipment, such as plasma etch tools, can be monitored and readjusted more often than in the conventional methodology, resulting in an increased yield of reliable products, wherein even the time consumed for obtaining the inspection results is significantly reduced. A further advantage of the present invention resides in the fact that the method is applicable on commercially available SEM tools which are steadily gaining in importance as inspection tools in a process line of a semiconductor facility, so that in many facilities a voltage contrast inspection tool may be available within the clean room. Moreover, in the first aspect of the present invention, i.e., when a pattern on the test wafer is compared to a reference image, it is possible to relate different depths, particularly different etch stop depths of the openings, to different voltage contrast levels, that is, different shades of gray, so as to obtain a qualitative or even quantitative calibration of the inspection tool. Moreover, the present invention provides for the possibility to form complex test patterns and test topographies on the wafer to obtain corresponding voltage contrast images which may correspond to the complex structure on the product wafer to be processed after releasing the process equipment under consideration. Since the wafers inspected according to the method of the present invention no longer need to be cleaved, it is now possible to re-work utilized test wafers for repetitive use. Moreover, one or more product wafers within a lot may be provided with a test die carrying a test pattern so that parameter drift over a plurality of product wafer lots may be continuously monitored without utilizing any test wafer. Further advantages and embodiments are defined in the appended claims.

BRIEF DESCRIPTION OF THE DRAWINGS

The invention may be understood by reference to the following description taken in conjunction with the accompanying drawings, in which like reference numerals identify like elements, and in which.

Figure 1:
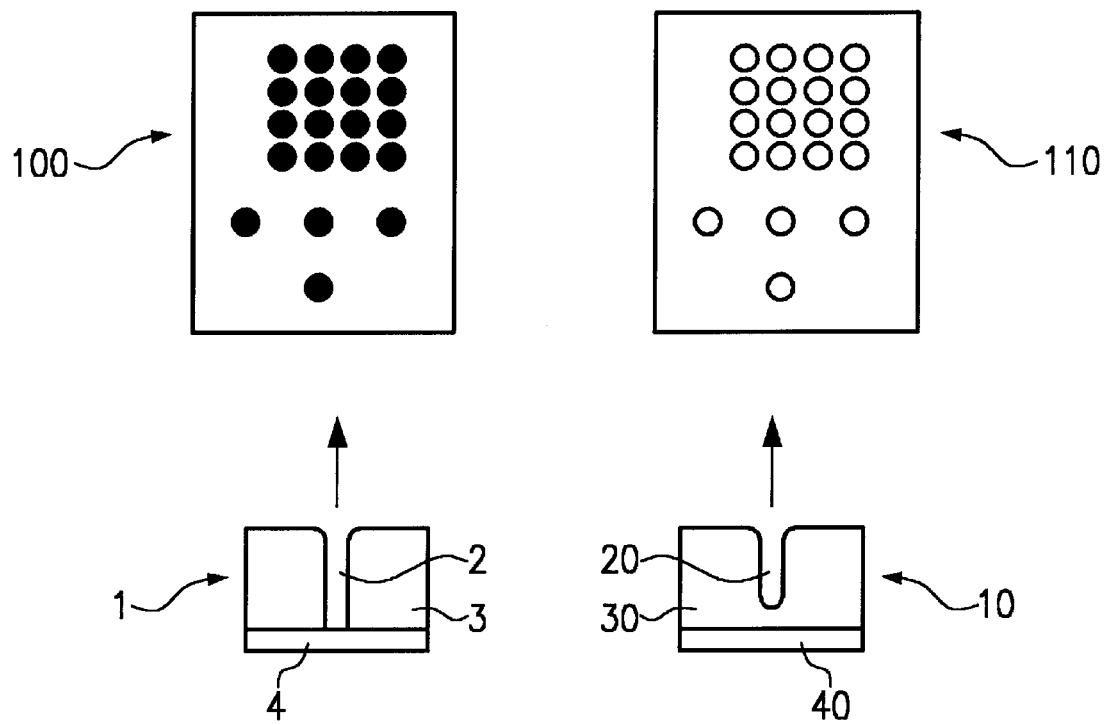
FIG. 1 schematically shows the assignment of an "open" contact, i.e., an opening that is formed on the surface of an underlying substrate, and of an opening which is not completely formed down to the surface of the substrate, to corresponding voltage contrast images.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The method of the present invention is described with reference to tool qualification of etch equipment which is used in critical etch processes in the manufacture of semiconductor devices such as, for example, forming local interconnects, wherein openings of a high aspect ratio are formed in a thick dielectric stack so as to provide for contact to underlying electrically conductive regions such as drain and source areas of a FET transistor. To this end, a test wafer, which may have identical specifications as the product wafers to be processed by the etch equipment, is provided with a dielectric layer, such as silicon dioxide, having a predefined thickness that is substantially identical to the etch depth required for the product wafers when processed in the etch equipment under consideration. The silicon dioxide may be deposited by low pressure CVD so that the adjustment of the thickness of the silicon oxide layer is precisely controllable. Subsequently, a photoresist layer is deposited and patterned by photolithography as is well known to the skilled person.

Thereafter, the test wafer, with the photolithographically patterned test pattern, is processed in the etch equipment for which process parameters controlling the etch depth of the process have to be checked. After the etch process under consideration is performed on the test wafer, the test wafer is brought to a voltage contrast inspection tool, which is preferably provided within the clean room, and even more preferably in the vicinity of the etch equipment so as to minimize the time for transportation of the test wafer. A variety of voltage contrast tools may be employed with the present invention, such as scanning electron microscopes of various types that allow the substrate to be biased.

It should be noted that the test wafer may be comprised of an electrically conductive substrate, such as lightly doped silicon or any other appropriate semiconductor material, and the dielectric layer may be formed thereabove. In situations where an insulating substrate is to be used, an electrically conductive layer, such as a semiconductor layer or a metal layer, may be deposited prior to the formation of the dielectric material layer. Moreover, although it is preferable to only provide one dielectric layer on the electrically conductive substrate, additional etch stop layers, as usually provided in processing of the product wafers, may also be deposited prior to the formation of the dielectric layer on the test wafer.

In FIG. 1, reference number 1 denotes a schematic illustration in which an opening 2 is formed in a thick dielectric material layer 3, which extends down to a silicon substrate 4. Reference number 10 denotes a schematic cross-sectional view of an opening 20 which is formed in a dielectric material 30 which is formed on a silicon substrate 40. Contrary to the opening 2, the bottom of the opening 20 is still covered by dielectric material.

Reference number 100 shows an example of a test pattern of multiple openings in the dielectric layer 3, in which each dark hole corresponds to an opening having the same characteristics as opening 2, when subjected to the voltage contrast inspection procedure with the voltage contrast inspection tool. That is, properly etched contact or via holes, such as opening 2, are "physically open" and, thus, act as a conducting path for the electrons emitted from the voltage contrast inspection tool, which may be a scanning electron microscope, so that a portion of the electrons is discharged to the grounded or positively biased substrate. The amount of bias depends on various factors such as the critical dimension and the aspect ratio of the openings, the type of layer(s) on and in which the openings 2 are formed, a tolerable residual thickness of dielectric material at the bottom of the openings 2, and the like. Reference number 110 denotes the test pattern for multiple openings when the openings have features similar to that of opening 20, i.e., when no conducting path from the opening 20 to the substrate 40 is provided for the electrons emitted by the voltage contrast inspection tool. Accordingly, incompletely etched openings, such as opening 20, are differently charged as compared to the openings 2 and, therefore, produce a completely different voltage contrast image which clearly indicates an insufficient opening depth and, hence, a parameter mismatch in the etch procedure.

It should be noted that the amount of remaining dielectric at the bottom of an opening is represented by a different degree of gray in the voltage contrast image, so that different depths, i.e., different amounts of remaining dielectric material at the bottom of an opening, may be assigned to different levels of gray. In this manner, a calibration of the voltage contrast image may be carried out for a variety of dielectric materials to be etched and a plurality of layer thicknesses of the dielectric material. By comparing few test wafers which have previously been investigated by the voltage contrast inspection method, with a subsequent cross-section analysis, which provides absolute values of the depth of the openings, it is possible to derive suitable correlation factors, so as to relate a certain gray level to an absolute depth value. Since the parameters for controlling the voltage contrast inspection tool, i.e., the SEM, are highly reproducible, such a quantitative calibration is "stable" over a long time period and does not require many test wafers to be subjected to expensive cross section analysis.

Contrast voltage values referring to an ideal test pattern may be stored in a database or in a reference table which may be provided in the form of a memory device within the voltage contrast inspection tool or may be provided as an external device which may be connected to the voltage contrast inspection tool by appropriate interface means as is well-known in the art. In case that an automatic facility management system is provided, which controls and monitors wafer handling and wafer processing, it is advantageous to supply the results of the wafer inspection to the automatic facility management system, wherein the reference voltage contrast image is stored in a database which may be accessed by the automatic facility management system. As previously mentioned, the database or the reference table may also include absolute depth values which have been obtained by cross-sectional analysis of a few test wafers so as to relate the results of the voltage contrast inspection to absolute values.

After scanning the test pattern, which takes about 5–10 minutes for a pattern area of about 100 $\mu m^2$, the contrast values of the individual openings are compared to the values of the reference image so as to determine whether or not the openings have the required depth. The judgment of whether a required depth is obtained or not by the process to be monitored, e.g., plasma etch for local interconnects, may be performed automatically in that a threshold value is set in advance and exceeding the threshold value then indicates an insufficient depth of the opening. The results of the voltage contrast inspection may also be displayed to an operator who, in turn, may then determine whether or not the depth of the openings meets the process requirements.

As previously pointed out, the depth of the opening is related to the etch rate of the etch equipment and, thus, to the process parameters which, in turn, may be readjusted if the comparison results in an insufficient depth of the openings. For this purpose, it is convenient to have a relationship between a gray level of the voltage contrast image and the corresponding remaining dielectric material which still covers the bottom of the openings. In particular, when an automatic facility management system is provided, the analysis of voltage contrast image and the readjustment of the process parameters may be performed automatically such that a sort of "feedback" loop is established in that, for example, one or more test wafers are included in a lot of product wafers to be processed and, since according to the present invention, measuring time for a single test pattern is short, a "quasi"-continuous monitoring of the process parameters and a corresponding controlling may be carried out. To this end, it is also possible to provide a test pattern at a predefined location of the product wafers so as to periodically analyze one or more product wafers for automatically readjusting the process parameters.

Figure 2:
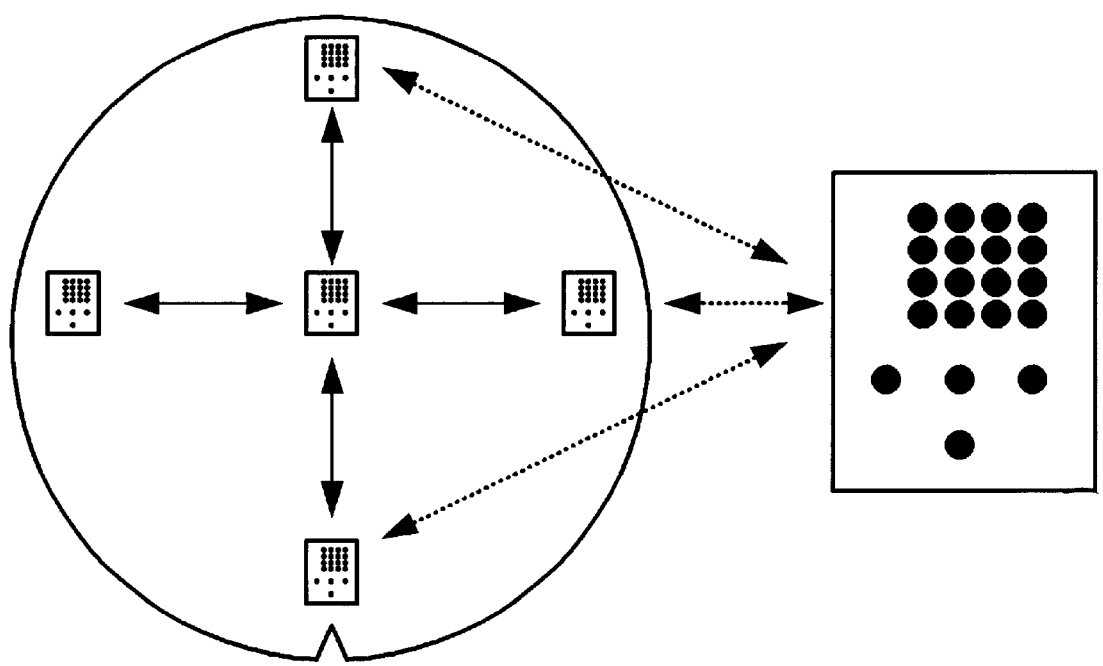
FIG. 2 schematically shows suitable locations for test patterns so as to inspect the depth of openings over an entire semiconductor wafer in accordance with the present invention.

FIG. 2 schematically shows a test wafer on which five test patterns, as shown in FIG. 1, are provided at predetermined locations, in this example at the center and the edge of the wafer. In this manner, the uniformity of the etch process over the entire surface of the wafer may easily be determined. Scanning of these five test patterns, each having an area of about 100 $\mu m^2$, requires less than 60 minutes measuring time, whereby the measuring data represents five different locations of the wafer. In contrast thereto, the conventional cross section analysis takes at least several hours, wherein it is difficult to prepare a plurality of samples from one single wafer. Each test pattern may individually be compared to the reference image stored in the database or in the reference table, wherein each individual opening may be compared to a corresponding reference opening so as to obtain depth information for each opening in the test pattern. This procedure may be especially advantageous when the test pattern comprises a topography which corresponds to the topography of the product wafer to be processed, since then the process can be monitored even at particularly critical locations, e.g., at underlying edges. If uniformity of the etch process is the main subject with which the measurement is concerned, it may be sufficient to choose one of the test patterns as a reference pattern and compare one or all of the remaining pattern with the selected reference pattern.

As previously mentioned, the obtained voltage contrast values of the individual openings may be related to absolute depth values which have been obtained by previously performed additional cross sectional analysis of a few test samples. Additionally, the voltage contrast values may be assigned to process parameters such as etch time, so that the comparison of the determined or measured voltage contrast values with a reference pattern, either as an ideal reference image in the database or reference table, or as a selected reference image on the test wafer, will directly provide corresponding values for one or more parameters for the etch process. Moreover, since the measuring time for a single test pattern according to the present invention is short, an appropriate test pattern may be designed which is provided on each product wafer so that one or more product wafers of the same or different lots may be compared to each other. This allows continuous monitoring of possible drifts of process parameters and an according readjustment of these parameters. Furthermore, preparation and scanning of a plurality of special test wafers can be obviated. Advantageously, such a test pattern on a product wafer is compared to a "reference product pattern" representing an ideal test pattern, either additionally or, instead, to a test pattern on different product wafers. A calibration with regard to the absolute depth of the openings in the test pattern may be performed in the same way as previously described. In this manner, additional information about the etch process can be obtained, since a test pattern, i.e., a test die, on the product wafer exhibits the same structure as the actual "product dies," including any etch stop layers actually used for forming the openings in the dielectric layer. Accordingly, with an appropriate calibration, i.e., a relationship between the gray levels of the voltage contrast image and a remaining thickness at the bottom of the opening, parameter values such as selectivity to the underlying etch stop layer or layers can be obtained from the measurement data. It should be noted that etch stop layers may also be formed on a test wafer, when the inventive methodology is performed with separate test wafers rather than product wafers. In order to maintain a required high vacuum in the voltage contrast inspection tool, typically an SEM, the photoresist may be removed prior to scanning the wafer.

As a result, the present invention allows a rapid scanning of test patterns formed either on test wafers or product wafers so as to determine the depth of openings which may be formed by, for example, an anisotropic etch process. To this end, voltage contrast values of each opening or averaged contrast values of a plurality of openings are compared to the values of a reference image and/or to the contrast values of a further test pattern. Advantageously, the reference contrast values are stored as a database or a reference table in a memory device in such a way that each single opening may be rapidly identified and compared to the corresponding reference contrast value. The memory device may be incorporated in the voltage contrast inspection tool or may be provided as an external device which is connected to the inspection tool. A controller unit, such as a microprocessor or a personal computer, may be connected to the memory device and the inspection tool and process the data obtained from the inspection tool such that the comparison to the reference image or to the further test pattern is carried out automatically or such that the results of the comparison are provided to an operator. Furthermore, the memory device may contain calibration data relating the gray level of the voltage contrast images to the amount of dielectric material remaining on the bottom of the openings. Moreover, absolute depth values may be assigned to respective gray levels of the voltage contrast image in that the results of a cross section analysis of a few test wafers are used. Additionally, the gray levels of the voltage contrast image may be assigned to process parameters such as etching time, pressure in the reaction chamber, etc. In case that an automatic wafer management system is installed in the semiconductor facility, the voltage contrast inspection tool is advantageously connected to the automatic management system so that the measurement results are monitored and processed to automatically readjust process parameters, thereby optimizing product quality and wafer throughput.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of inspecting a depth of an opening of a dielectric material formed on a substrate, the method comprising:

depositing a dielectric material layer of a predefined thickness on a surface of the substrate;

forming a predefined pattern of openings in the dielectric material layer at at least one predetermined position on the substrate;

providing a voltage contrast inspection tool and determining a voltage contrast image of the predefined pattern;

comparing the determined voltage contrast image with a reference image corresponding to a voltage contrast image for the predefined pattern with the openings fully opened down to a surface of the substrate; and estimating the amount of dielectric material covering a bottom of the openings based upon the comparison of the determined voltage contrast image and the reference image.

2. The method of claim 1, wherein the substrate is one of an electrically conductive substrate and a semiconductive substrate.

3. The method of claim 1, wherein formation of a predefined pattern of openings is carried out by photolithography and etching.

4. The method of claim 3, wherein the thickness of the dielectric material is selected so as to correspond to a desired depth of the openings obtained by said etching process.

5. The method of claim 3, wherein a photoresist layer is removed prior to the measurement with the voltage contrast inspection tool.

6. The method of claim 1, wherein the voltage contrast inspection tool is a scanning electron microscope.

7. The method of claim 1, wherein the substrate is a test substrate so as to serve as a means for determining process parameters of the process of forming openings in subsequent product substrates.

8. The method of claim 1, wherein the voltage contrast inspection tool is connected to a memory device for storing voltage contrast values of respective openings of the pattern as reference values.

9. The method of claim 8, wherein the voltage contrast inspection tool and the memory device are connected to a control unit for performing the comparison step and the estimation step.

10. The method of claim 1, wherein two or more patterns of identical structure are formed on the substrate at at least one center position and at least one edge position.

11. The method of claim 1, wherein at least two predetermined patterns of identical structure are formed on the substrate and compared to each other.

12. The method of claim 1, wherein the reference image is stored in advance of depositing the dielectric material layer.

13. The method of claim 1, wherein the comparison is made by setting a contrast threshold value received from the reference image, and determining whether or not a contrast value of respective openings of the predefined pattern exceed the contrast threshold value.

14. The method of claim 1, wherein a plurality of different gray levels of the voltage contrast image of the predefined pattern are related to respective different amounts of remaining dielectric material at the bottom of the opening.

15. The method of claim 14, wherein at least one of said plurality of different gray levels is associated with an absolute depth value of the opening by carrying out a cross sectional analysis of the predefined pattern.

16. A method of inspecting a depth of an opening of a dielectric material layer formed on a substrate, the method comprising:

depositing a dielectric material layer of a predefined thickness on a surface of the substrate;

forming at least two predefined patterns of openings in the dielectric material layer at respective predetermined positions on the substrate;

providing a voltage contrast inspection tool and measuring a voltage contrast image of the predefined patterns;

comparing the respective voltage contrast images with each other; and estimating the amount of dielectric material covering a bottom of the openings of one of the at least two predefined patterns based upon said comparison of said respective voltage contrast images.

17. The method of claim 16, wherein the substrate is one of an electrically conductive substrate and a semiconductive substrate.

18. The method of claim 16, wherein formation of a predefined pattern of openings is carried out by photolithography and etching.

19. The method of claim 18, wherein the thickness of the dielectric material is selected so as to correspond to a desired depth of the openings obtained by said etching process.

20. The method of claim 18, wherein a photoresist layer is removed prior to the measurement with the voltage contrast inspection tool.

21. The method of claim 16, wherein the voltage contrast inspection tool is a scanning electron microscope.

22. The method of claim 16, wherein the substrate is a test substrate so as to serve as a means for determining process parameters of the process of forming openings in subsequent product substrates.

23. The method of claim 16, wherein the voltage contrast inspection tool is connected to a memory device for storing voltage contrast values of respective openings of the pattern as reference values.

24. The method of claim 23, wherein the voltage contrast inspection tool and the memory device are connected to a control unit for performing the comparison step and the estimation step.

25. The method of claim 16, wherein two or more patterns of identical structure are formed on the substrate at at least one center position and at least one edge position.

26. The method of claim 16, wherein at least two predetermined patterns of identical structure are formed on the substrate and compared to each other.

27. The method of claim 16, wherein the reference image is stored in advance of depositing said layer of dielectric material.

28. The method of claim 16, wherein the comparison is made by setting a contrast threshold value received from the reference image, and determining whether or not a contrast value of respective openings of the predefined pattern exceed the contrast threshold value.

29. The method of claim 16, wherein a plurality of different gray levels of the voltage contrast image of the predefined pattern are related to respective different amounts of remaining dielectric material at the bottom of the opening.

30. The method of claim 29, wherein at least one of said plurality of different gray levels is associated with an absolute depth value of the opening by carrying out a cross sectional analysis of the predefined pattern.

31. The method of claim 16, wherein at least one of the at least two predefined patterns is compared to a reference image.

32. The method of claim 16, wherein a comparison is made by setting a contrast threshold value received from one of the at least two predefined patterns, and determining whether or not a contrast value of respective openings of the other of the at least two predefined patterns exceed the contrast threshold value.

33. A method of monitoring a parameter in an etch process, comprising:

providing a plurality of substrates, each having at least one test pattern comprised of a plurality of openings in a dielectric material layer, the test pattern being formed during the etch process;

providing a voltage contrast inspection tool;

generating a first voltage contrast image of the at least one test pattern of a first substrate of said plurality of substrates;

generating a second voltage contrast image of the at least one test pattern of a second substrate of said plurality of substrates; and comparing the first and the second voltage contrast images with each other to determine whether a drift of an etch process parameter has occurred.

34. A method of monitoring a parameter in an etch process, comprising:

providing a voltage contrast inspection tool;

providing a plurality of substrates, each having at least one test pattern comprised of a plurality of openings in a dielectric material layer, the test pattern being formed during the etch process;

storing voltage contrast values of one of said test patterns as a reference image;

generating a first voltage contrast image of the at least one test pattern of a first substrate of said plurality of substrates;

generating a second voltage contrast image of the at least one test pattern of a second substrate of said plurality of substrates; and comparing the first and second voltage contrast images with the reference image to determine whether a drift of an etch process parameter has occurred.

* * * * *